(12) United States Patent
Kubo et al.

(10) Patent No.: US 9,872,378 B2
(45) Date of Patent: Jan. 16, 2018

(54) ELECTRONIC ELEMENT MOUNTING BOARD AND ELECTRONIC DEVICE

(71) Applicant: KYOCERA Corporation, Kyoto-shi, Kyoto (JP)

(72) Inventors: Shuya Kubo, Kyoto (JP); Kouki Suda, Kyoto (JP); Tsuyoshi Ishimabushi, Kyoto (JP); Shinji Ichiki, Kyoto (JP); Yousuke Moriyama, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 50 days.

(21) Appl. No.: 14/650,353

(22) PCT Filed: Apr. 28, 2014

(86) PCT No.: PCT/JP2014/061917
§ 371 (c)(1),
(2) Date: Jun. 8, 2015

(87) PCT Pub. No.: WO2014/175460
PCT Pub. Date: Oct. 30, 2014

(65) Prior Publication Data
US 2015/0319846 A1    Nov. 5, 2015

(30) Foreign Application Priority Data

Apr. 26, 2013   (JP) ................................. 2013-094036
Oct. 23, 2013   (JP) ................................. 2013-220261

(51) Int. Cl.
*H01L 23/13*   (2006.01)
*H01L 23/15*   (2006.01)
(Continued)

(52) U.S. Cl.
CPC ..... *H05K 1/0216* (2013.01); *H01L 27/14618* (2013.01); *H05K 1/181* (2013.01);
(Continued)

(58) Field of Classification Search
CPC ........... H01L 2224/16225; H01L 23/13; H01L 23/15; H01L 23/49822; H01L 23/49866;
(Continued)

(56) References Cited

U.S. PATENT DOCUMENTS

2004/0263671 A1* 12/2004 Takagi .................... H01L 25/16
348/340
2005/0169620 A1    8/2005 Minamio et al.
(Continued)

FOREIGN PATENT DOCUMENTS

JP    2001-111873 A    4/2001
JP    2004-363511 A    12/2004
(Continued)

OTHER PUBLICATIONS

International Search Report, PCT/JP2014/061917, dated Aug. 12, 2014, 2 pgs.

*Primary Examiner* — Jenny L Wagner
*Assistant Examiner* — Michael P McFadden
(74) *Attorney, Agent, or Firm* — Volpe and Koenig, P.C.

(57) ABSTRACT

There are provided an electronic element mounting board and an electronic device capable of suppressing transmission of incident light to an electronic device through a circumferential edge part of an opening of a board and thus of reducing a noise level in receiving an image. An electronic element mounting board includes an insulating substrate. The insulating substrate has an opening and a lower surface, and an electronic element is disposed on the lower surface so as to overlap the opening in a plan view. A circumferential edge part of the opening of the insulating substrate has a porosity lower than a porosity of a portion outside the circumferential edge part. Since it is possible to suppress transmission of incident light to the electronic element (Continued)

through the circumferential edge part, it is possible to reduce a noise level in receiving an image in the electronic element.

9 Claims, 6 Drawing Sheets

(51) Int. Cl.
    *H05K 1/02*     (2006.01)
    *H05K 1/18*     (2006.01)
    *H01L 27/146*     (2006.01)
    *H05K 1/11*     (2006.01)
    *H01L 23/498*     (2006.01)

(52) U.S. Cl.
    CPC .............. *H05K 1/183* (2013.01); *H01L 23/13* (2013.01); *H01L 23/15* (2013.01); *H01L 23/49822* (2013.01); *H01L 23/49866* (2013.01); *H01L 2224/16225* (2013.01); *H05K 1/111* (2013.01); *H05K 2201/0116* (2013.01); *H05K 2201/09036* (2013.01); *H05K 2201/10121* (2013.01); *H05K 2201/2018* (2013.01); *Y02P 70/611* (2015.11)

(58) Field of Classification Search
    CPC . H01L 27/14618; H01L 1/111; H05K 1/0216; H05K 1/111; H05K 1/181; H05K 1/183; H05K 2201/0116; H05K 2201/09036; H05K 2201/10121; H05K 2201/2018; Y02P 70/611

USPC ....... 361/767, 728, 736, 742, 748, 758, 770; 174/255, 260, 261
    See application file for complete search history.

(56) References Cited

U.S. PATENT DOCUMENTS

| | | |
|---|---|---|
| 2005/0259174 A1 | 11/2005 | Nishio et al. |
| 2008/0237768 A1* | 10/2008 | Yajima .................... H01L 23/26 257/434 |
| 2010/0193240 A1 | 8/2010 | Takayama |
| 2012/0211852 A1* | 8/2012 | Iwafuchi ........... H01L 27/14618 257/435 |
| 2013/0134538 A1* | 5/2013 | Sato .................... H01L 31/0232 257/432 |
| 2013/0209780 A1* | 8/2013 | Poxson ................. C23C 14/083 428/312.6 |

FOREIGN PATENT DOCUMENTS

| | | |
|---|---|---|
| JP | 2005-252223 A | 9/2005 |
| JP | 2005-278093 A | 10/2005 |
| JP | 2006-013440 A | 1/2006 |
| JP | 2006-201427 A | 8/2006 |
| JP | 2007-318250 A | 12/2007 |
| JP | 2008-306350 A | 12/2008 |
| JP | 2010-206158 A | 9/2010 |

* cited by examiner

ELECTRONIC ELEMENT MOUNTING BOARD AND ELECTRONIC DEVICE

TECHNICAL FIELD

The present invention relates to an electronic element mounting board on which an electronic element, for example, a charge coupled device (CCD) type or complementary metal oxide semiconductor (CMOS) type imaging element is mounted, and an electronic device.

BACKGROUND ART

In the related art, there is an electronic device in which a CCD type or CMOS type imaging element is mounted on a board and which is applied to a digital camera, an optical sensor, and the like. As such an electronic device, an electronic device mainly including a board and an imaging element is known. The board is provided with an opening formed at a center thereof and a recess formed in a lower surface thereof, in which the opening is located inside the recess in a plan view. In addition, the imaging element is flip-chip mounted on a bottom of the recess of the board (for example, refer to Patent Literature 1).

On the bottom of the recess of the board, electrode pads are disposed around the opening, and external terminals are disposed in an outer circumferential part thereof. In this electronic device, light (image) input to a light receiving part of the imaging element via the opening is converted into an electric signal by the imaging element, and the electric signal is transmitted to the electrode pads on the board.

CITATION LIST

Patent Literature

Patent Literature 1: Japanese Unexamined Patent Publication JP-A 2006-201427

SUMMARY OF INVENTION

Technical Problem

However, in recent years, since the electronic device has been miniaturized and the board has been thinned, there is a case where light incident to the electronic device is transmitted through a circumferential edge part of the opening of the board. This transmitted light may be received in the imaging element and may cause noise in receiving an image.

The invention has been made in light of the problem of the related art, and an object thereof is to provide an electronic element mounting board and an electronic device capable of suppressing transmission of incident light to an electronic device through a circumferential edge part of an opening of a board and thus of reducing a noise level in receiving an image.

Solution to Problem

An electronic element mounting board according to an aspect of the invention includes an insulating substrate having a lower surface and an opening which opens on the lower surface; and an electrode pad disposed on the lower surface around the opening, in which at least a part of a circumferential edge part of the opening has a porosity lower than a porosity of a portion outside the circumferential edge part in the insulating substrate.

An electronic device according to another aspect of the invention includes the above-described electronic element mounting board; and an electronic element which is disposed on a lower surface side so as to overlap the opening in a plan view and is electrically connected to the electrode pad.

Advantageous Effects of Invention

In the electronic element mounting board according to the aspect of the invention, since at least a part of the circumferential edge part of the opening has a porosity lower than the porosity of the portion outside the circumferential edge part in the insulating substrate, it is possible to suppress transmission of incident light to an electronic element through the circumferential edge part of the opening of the insulating substrate. As a result, it is possible to reduce a noise level in receiving an image.

The electronic device according to the aspect of the invention includes the above-described electronic element mounting board, and thus it is possible to reduce a noise level in receiving an image.

DESCRIPTION OF EMBODIMENTS

Hereinafter, some exemplary embodiments of the invention will be described with reference to the drawings. In addition, in the following description, a configuration in which an electronic element is mounted on an electronic element mounting board is adopted as an electronic device. In the electronic element mounting board and the electronic device, any direction may be regarded to be an upper side or a lower side, but, for convenience, an orthogonal coordinate system xyz is defined, and the term "upper surface" or "lower surface" is used with a positive side in a z direction as an upper side.

First Embodiment

Figure 1:
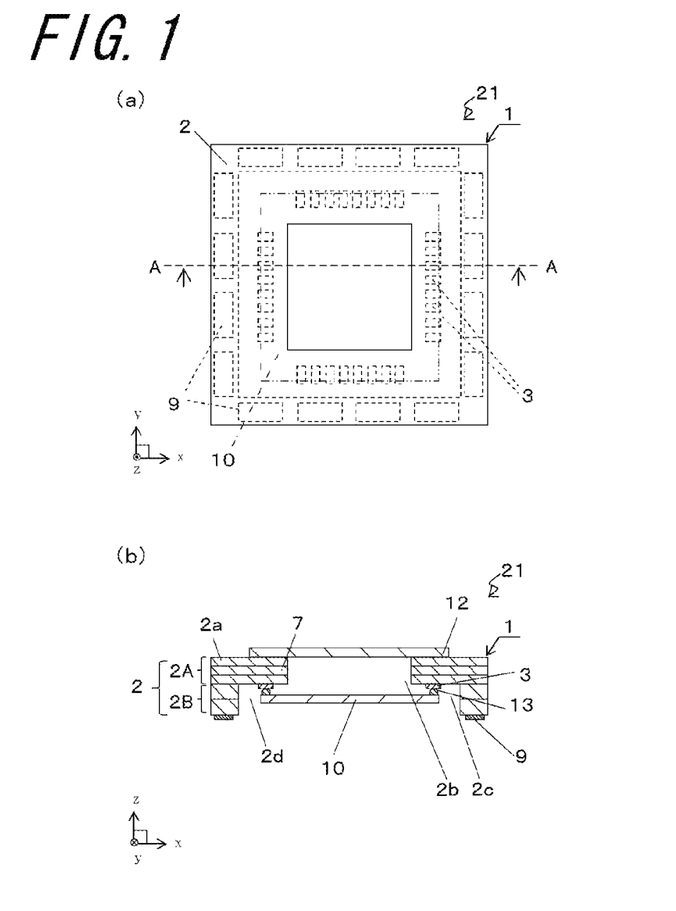
FIG. 1(a) is a plan view illustrating an electronic element mounting board and an electronic device according to a first embodiment of the invention.
FIG. 1(b) is a cross-sectional view illustrating a cross-section of the electronic device taken along the line A-A in FIG. 1(a)

With reference to FIG. 1, an electronic device 21 and an electronic element mounting board 1 in a first embodiment of the invention will be described. The electronic device 21 in the present embodiment includes the electronic element mounting board 1 and an electronic element 10.

In an example illustrated in FIG. 1, the electronic element mounting board 1 includes an insulating substrate 2 provided with a lower surface and an opening 2b which opens on the lower surface, and electrode pads 3 disposed on the lower surface around the opening 2b. In the insulating substrate 2, at least a part of a circumferential edge part 7 of the opening 2b has a porosity lower than that of a portion outside the circumferential edge part 7.

In the example illustrated in FIG. 1, the insulating substrate 2 includes a first frame 2A and a second frame 2B. The first frame 2A is disposed on an upper surface of the second frame 2B. The first frame 2A has a through hole with a smaller width than that of a through hole 2c of the second frame 2B. The through hole of the first frame 2A is the above-described opening 2b.

In the example illustrated in FIG. 1, a plurality of electrode pads 3 are disposed on the lower surface (a lower surface of the first frame 2A) of the insulating substrate 2 around the opening 2b. The electrode pads 3 are connected to respective electrodes of the electronic element 10 via connection conductors 13.

In addition, external terminals 9 are disposed on an outer circumferential part (a lower surface of the second frame 2B) of the insulating substrate 2. Further, the external terminals 9 may be disposed on the upper surface or a side surface of the insulating substrate 2. The external terminals 9 are disposed, for example, for electrical connection between the electronic device 21 and an external circuit board, an external device, or the like.

In the example illustrated in FIG. 1, a recess 2d is formed by an inner surface of the second frame 2B and a lower surface of the first frame 2A. The electronic element 10 is disposed in the recess 2d.

As a material of the insulating substrate 2, for example, electrically insulating ceramics are used. Examples of the electrically insulating ceramics may include an aluminum oxide sintered body, a mullite sintered body, a silicon carbide sintered body, an aluminum nitride sintered body, a silicon nitride sintered body, or a glass ceramic sintered body.

In the example illustrated in FIG. 1, the insulating substrate 2 is formed by vertically laminating five-layered insulating layers 2a which are substantially square-shaped and are made of the above-described material. The number of layers of the insulating layers 2a forming the insulating substrate 2 is not limited to five as illustrated in FIG. 1. The insulating substrate 2 may be composed of a single layer, or may be composed of two or more insulating layers.

In a case where the insulating substrate 2 is made of electrically insulating ceramics, the electrode pads 3 and the external terminals 9 are made of tungsten (W), molybdenum (Mo), manganese (Mn), silver (Ag), or copper (Cu), or an alloy containing one or more kinds of metal materials selected therefrom.

A plating layer is preferably disposed on exposed surfaces of the electrode pads 3 and the external terminals 9. With this configuration, it is possible to protect the exposed surfaces of the electrode pads 3 and the external terminals 9 and thus to prevent oxidation thereof. In addition, with this configuration, it is possible to achieve favorable electrical connection between the electrode pads 3 and the electronic element 10 using the connection conductors 13 (gold bumps or the like) or favorable electrical connection between the external terminals 9 and an external circuit board. As the plating layer, for example, an Ni plating layer which is 0.5 µm to 10 µm thick may be coated. In addition, a gold (Au) plating layer which is 0.5 µm to 3 µm thick may be coated on the Ni plating layer.

Figure 2:
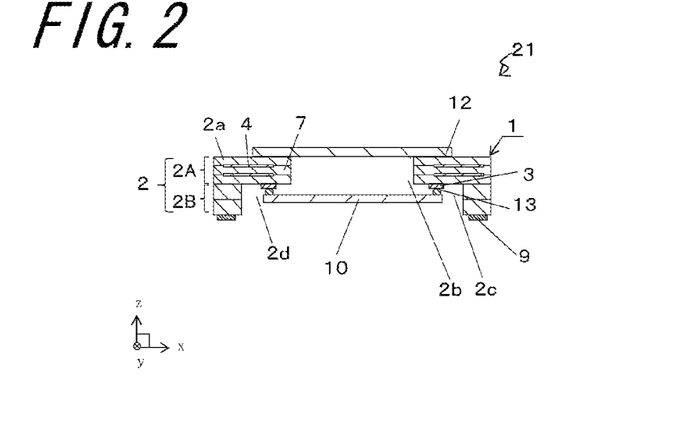
FIG. 2 is a cross-sectional view illustrating another example of the electronic element mounting board and the electronic device illustrated in FIG. 1.

Further, as in an example illustrated in FIG. 2, auxiliary layers 4 may be provided between the insulating layers 2a of the insulating substrate 2. The auxiliary layers 4 are made of, for example, a metal material or an insulating material.

In a case where the auxiliary layers 4 are made of a metal material, the auxiliary layers may function as internal conductors so as to electrically connect the external terminals 9 to the electrode pads 3. In this case, the respective auxiliary layers 4 may be electrically connected to each other, for example, via through conductors made of the same metal material as that of the auxiliary layers 4.

In a case where the auxiliary layers 4 are made of the metal material, the metal material may be, for example, tungsten (W), molybdenum (Mo), manganese (Mn), silver (Ag), or copper (Cu), or an alloy containing one or more kinds of metal materials selected therefrom.

In a case where the auxiliary layers 4 are made of an insulating material, the insulating material may be, for example, an aluminum oxide sintered body, a mullite sintered body, a silicon carbide sintered body, an aluminum nitride sintered body, a silicon nitride sintered body, or a glass ceramic sintered body. In a case where the auxiliary layers 4 are made of the insulating material, the auxiliary layers 4 have smaller dimensions than the insulating layers forming the insulating substrate 2 in a top view.

In the example illustrated in FIG. 1, in the insulating substrate 2, the at least a part of a circumferential edge part 7 of the opening 2b has a porosity lower than that of a portion outside the circumferential edge part 7. With this configuration, for example, in a case where the insulating substrate 2 is an insulating ceramic substrate, the number of voids which are portions through which light is transmitted is small in the circumferential edge part 7, and thus it is possible to reduce a possibility that the light may be transmitted therethrough. This is because it is possible to reduce a ratio at which a plurality of voids between ceramic particles overlap each other in a Z axis direction. Therefore, since an amount of light which is transmitted through the circumferential edge part 7 can be reduced, it is possible to reduce noise at the time of receiving light.

Generally, in a case where the insulating substrate 2 is an insulating ceramic substrate, voids are generated between internal particles of the insulating substrate 2. For this reason, if the insulating substrate 2 is thinned, a distance from the upper surface of the insulating substrate 2 to the lower surface thereof is shortened, and thus there is a concern that voids overlap each other in a plan view and thus light is transmitted through the voids of the insulating substrate 2. Particularly, in a case where a light receiving surface of the electronic element 10 is close to the circumferential edge part 7, there is a concern that light transmitted through the circumferential edge part 7 is received by the light receiving surface. With this configuration, it is possible to reduce an amount of residual light which is transmitted through the circumferential edge part 7 and is received.

In addition, the circumferential edge part 7 of the opening of the insulating substrate 2 may be regarded as a portion located further inward than the electrode pads 3 which are located around the opening.

Further, the porosity of the insulating substrate 2 may be expressed by a ratio at which voids occupy the unit area in a case where an insulator is cut into pieces, and a cut surface is observed by using, for example, a scanning electron microscope (SEM). In a portion of the insulating substrate 2 which has a low porosity, a proportion of insulators forming the insulating substrate 2 is high, that is, a density of the insulators is high.

The porosity of the circumferential edge part 7 is, for example, about 5% or less. Since the porosity of about 5% or less is low, light transmission can be sufficiently prevented.

The porosity of the portion outside the circumferential edge part 7 is about 13% or less. Since the porosity of about 13% or less is considerably high, it is possible to prevent a reduction in the strength thereof.

In addition, for example, the porosity of the circumferential edge part 7 is preferably equal to or lower than about 70% of the porosity of the portion outside the circumferential edge part 7. For example, if the porosity of the portion outside the circumferential edge part 7 is 10%, the porosity of the circumferential edge part 7 is preferably 7% or less. In this case, since voids between the particles of the circumferential edge part 7 can be efficiently reduced, it is possible to suppress arrival of light transmitted through the circumferential edge part 7 of the insulating substrate 2 at the light receiving part of the electronic element 10.

The reason why the porosity of the portion outside the circumferential edge part 7 is higher than the porosity of the circumferential edge part 7 is that it is generally difficult to reduce the porosity of the entire insulating substrate 2. For example, in order to reduce the porosity of the entire insulating substrate 2, it is necessary to use a special material or to use a special method, and thus the cost increases. In addition, as will be described later in the following manufacturing method, in order to reduce the porosity, high pressure is required to be applied. Therefore, if such high pressure is applied to the portion outside the circumferential edge part 7, there is a high possibility that an internal conductor formed in this portion may be disconnected. Thus, the porosity of only the circumferential edge part 7 is lower than that of the portion outside the circumferential edge part 7.

Further, a portion of the circumferential edge part 7 which has a low porosity is preferably located so as to surround the opening 2b. Consequently, it is possible to further suppress transmission of light through the circumferential edge part 7 compared with a case where the portion which has a low porosity is partly located only in the vicinity of the opening 2b.

In addition, the electronic element 10 and the lower surface of the insulating substrate 2 are preferably adhered to each other via an underfill. Consequently, it is possible to protect the connection parts with the electrode pads 3 and also to prevent light from entering the light receiving part of the electronic element 10. This underfilling is performed by using, for example, an epoxy resin.

Further, the insulating substrate 2 is preferably black. If the insulating substrate 2 is black, in a case where the insulating substrate 2 is made of insulating ceramics, it is possible to achieve the above-described effect of reducing transmission of light and also to make transmission of the light difficult through absorption of the light in the insulating substrate 2. Therefore, for example, in a case where the electronic element 10 is an imaging element, it is possible to further reduce noise in receiving an image.

Furthermore, a color of the insulating substrate 2 is measured by using a colorimeter such as a spectrophotometer. Black may be interpreted as the brightness (L*) being 0 to 50 in the L*a*b* color system.

Next, with reference to FIG. 1, the electronic device 21 will be described. In the example illustrated in FIG. 1, the electronic device 21 includes the electronic element mounting board 1, and the electronic element 10 which is disposed on the lower surface side so as to overlap the opening 2b in a plan view and is electrically connected to the electrode pads 3.

As the electronic element 10, for example, a CCD type or CMOS type imaging element is used. In the example illustrated in FIG. 1, the electronic element 10 is disposed in the recess 2d so as to overlap the opening in a plan view. The electronic element 10 includes a plurality of electrodes. The electrodes are respectively electrically connected to the plurality of electrode pads 3 formed on the lower surface of the insulating substrate 2 via the connection conductors 13 such as gold bumps. In other words, the electronic element 10 is flip-chip mounted on the electrode pads 3.

In addition, as the connection conductor 13, not only the gold bump but also, for example, solder or a conductive resin (anisotropic conductive resin) is used.

A lid body 12 may be a plate made of, for example, a glass material. In addition, the lid body 12 may be, for example, a plate-shaped optical filter. Further, the lid body 12 is joined to the upper surface of the insulating substrate 2 via, for example, an adhesive (not illustrated) such as a thermosetting resin or low melting point glass.

Next, a description will be made of an example of a manufacturing method of the electronic element mounting board 1 of the present embodiment. In addition, the example of the manufacturing method described below is a manufacturing method using a segmentable wiring board.

(1) First, a ceramic green sheet forming the insulating substrate 2 is formed. For example, in a case where the insulating substrate 2 which is an aluminum oxide ($Al_2O_3$) sintered body is obtained, powder of silica ($SiO_2$), magnesia (MgO), calcia (CaO), or the like is added to powder of $Al_2O_3$, and a proper binder, solvent and plasticizer are further added thereto as a sintering additive. Then, this mixture is kneaded into a slurry. Then, a ceramic green sheet for multiple patterns is obtained according to a molding method such as a doctor blade method or a calendar roll method which is well known in the related art.

(2) Next, a metal paste is coated on portions which will become the electrode pads 3 and the external terminals 9 in the ceramic green sheet obtained through the above-described step (1) according to a screen printing method. The metal paste is co-fired with the ceramic green sheet which will become the insulating substrate 2, and thus the electrode pads 3, the external terminals 9, and the like are formed.

The metal paste is manufactured by adding a proper solvent and binder to metal powder made of the above-described metal material and kneading the mixture so as to be adjusted to a proper viscosity. In addition, the metal paste may contain glass or ceramics in order to increase the joining strength with the insulating substrate 2.

In addition, the same method may also be used in a case where the auxiliary layers 4 are provided. For example, in a case where the auxiliary layers 4 are made of a metal material, the above-described metal paste may be coated on the ceramic green sheet which will become the insulating substrate 2.

Further, in a case where the auxiliary layers 4 are made of an insulating material, a paste made of this insulating material may be coated on the ceramic green sheet which will become the insulating substrate 2.

(3) Next, the above-described green sheet is processed by using a metal mold. In this step, a through hole for the opening 2b or the through hole 2c is formed at the center of the green sheet.

(4) Next, the ceramic green sheets which will become respective insulating layers are laminated and are pressed so that a ceramic green sheet laminate which will become the insulating substrate 2 is manufactured. In addition, in this step, for example, a ceramic green sheet laminate (the first frame 2A) having the opening 2b and a ceramic green sheet laminate (the second frame 2B) having the through hole 2c may be separately manufactured, and both of the laminates may be laminated and pressed so as to manufacture a green sheet laminate which will become the insulating substrate 2.

In addition, at this time, wiring conductors may be exposed to surfaces of the green sheet laminate which will become the first frame 2A and the green sheet laminate which will become the second frame 2B, and both of the laminates may be laminated and pressed so that the wiring conductors are electrically connected to each other.

Figure 9:
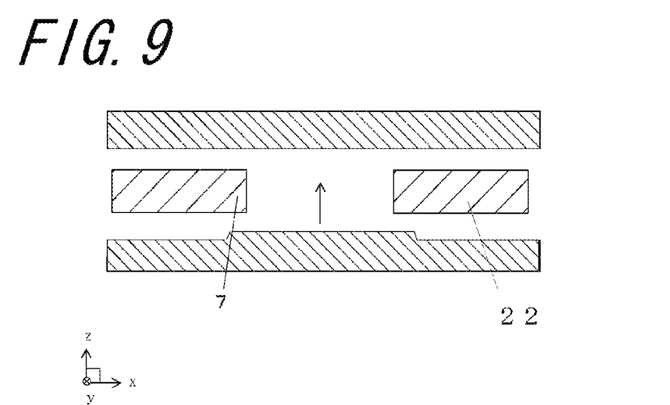
FIG. 9 is a cross-sectional view illustrating a step of forming a portion which will become a circumferential edge part in a ceramic green sheet laminate in a manufacturing method of an electronic element mounting board according to an embodiment of the invention.

In this step, a pressing member (metal mold) as in an example illustrated in FIG. 9 is used to form a green sheet laminate 22 which will become the first frame 2A. The laminate 22 is pressed and formed by using the upper pressing member and the lower pressing member.

A convex part is formed on an upper surface of the lower pressing member. During pressing, the circumferential edge part 7 of the laminate 22 is pressed by the convex part. Therefore, a greater pressing force is applied to the circumferential edge part 7 than to the portion outside the circumferential edge part 7. Therefore, the at least a part of the circumferential edge part 7 has a porosity lower than that of the portion outside the circumferential edge part 7.

(5) Next, the ceramic green sheet laminate is fired at a temperature of about 1500° C. to 1800° C. so that a segmentable wiring board on which a plurality of insulating substrates 2 are arranged is obtained. In addition, in this step, the above-described metal paste becomes the electrode pads 3 and the external terminals 9.

(6) Next, the segmentable wiring board obtained through the firing is divided into a plurality of insulating substrates 2. In this division, a method may be used in which division grooves are formed on the segmentable wiring board along locations corresponding to outer edges of the insulating substrates 2, and the segmentable wiring board is broken along the division grooves so as to be cut, or a method may be used in which the segmentable wiring board is cut along locations corresponding to outer edges of the insulating substrates 2 by using a slicing method. In addition, the division grooves may be formed by cutting the division grooves having thicknesses smaller than that of the segmentable wiring board by using a slicing device after the firing is performed, but may be formed by pushing a cutter blade into the ceramic green sheet laminate for the segmentable wiring board, or by cutting the division grooves having thicknesses smaller than that of the ceramic green sheet laminate by using the slicing device.

The electronic element mounting board 1 is obtained through the above-described steps (1) to (6).

In the step (4), a portion pressed by the convex part of the pressing member is preferably the inside of the paste which will become the electrode pads 3. Consequently, it is possible to reduce a possibility that the paste which will become the electrode pads 3, the auxiliary layers 4, and the external terminals 9 may be deformed or disconnected.

In addition, in the step (4), as illustrated in FIG. 9, a lower surface of the upper pressing member is preferably horizontal. In this case, an upper surface of the laminate 22 is pressed against the horizontal surface. Thus, the upper surface of the electronic element mounting board 1 becomes horizontal, and thus, for example, an infrared cutoff filter or the glass lid body 12 can be mounted on the upper surface of the electronic element mounting board 1 without being inclined. Therefore, it is possible to suppress refraction of light due to inclination and thus to obtain an image in which a noise level is low.

The electronic element 10 is mounted on the electronic element mounting board 1 formed in the above-described way so that the electronic device 21 can be manufactured.

Second Embodiment

Next, with reference to FIG. 3 to FIG. 5, a description will be made of an electronic element mounting board 1 and an electronic device 21 according to a second embodiment of the invention. In addition, the lid body 12 is omitted in the electronic device 21 illustrated in FIG. 3 to FIG. 5. The electronic device 21 of the present embodiment is different from the electronic device 21 of the first embodiment in terms of positions of inner edges of the auxiliary layers 4. Further, also in the present embodiment, in the same manner as in the first embodiment, the circumferential edge part 7 of the opening 2b of the insulating substrate 2 has the porosity which is lower than that of the portion outside the circumferential edge part 7.

Figure 3:
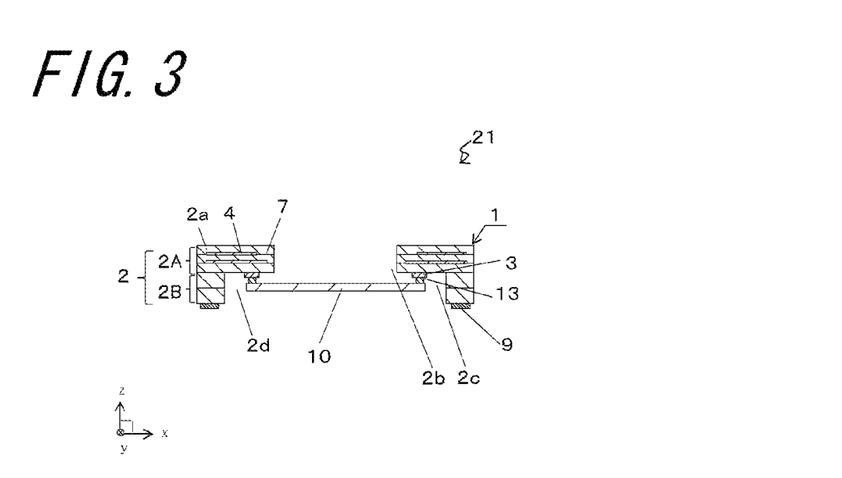
FIG. 3 is a cross-sectional view illustrating a cross-section of an electronic element mounting board and an electronic device according to a second embodiment of the invention.

In an example illustrated in FIG. 3, the insulating substrate 2 is composed of a plurality of insulating layers 2a, and the auxiliary layers 4 are provided between the insulating layers 2a of the insulating substrate 2. A part of at least one of the auxiliary layers 4 is located at the circumferential edge part 7. With this configuration, light to be transmitted through the circumferential edge part 7 of the opening 2b of the insulating substrate 2 can be blocked by the auxiliary layers 4 a part of which is located at the circumferential edge part 7. Since the auxiliary layers 4 are provided, it is possible to reduce a probability that voids of the circumferential edge part 7 overlap each other in a top view. For this reason, it is possible to further enhance suppression of transmission of the above-described light. Therefore, it is possible to suppress incidence of excess light to the electronic element 10.

In the example illustrated in FIG. 3, two-layer auxiliary layers 4 are disposed between the layers 2a of the insulating substrate 2. In addition, among the auxiliary layers, an inner edge of the auxiliary layer 4 on the lower side is located at the circumferential edge part 7.

The auxiliary layers 4 are preferably made of a metal material. In this case, it is possible to more efficiently reduce an amount of light which is transmitted through the insulating substrate 2. This is because, in a case where the insulating layers 2a are made of an electrically insulating ceramic, the electrically insulating ceramics may contain a high proportion of a glass component having high light transmittance, and thus the metal material can more efficiently block light than the insulating substrate 2.

In addition, the auxiliary layers 4 preferably have the low porosity. Thus, it is possible to further block light to be transmitted through the circumferential edge part 7.

Figure 4:
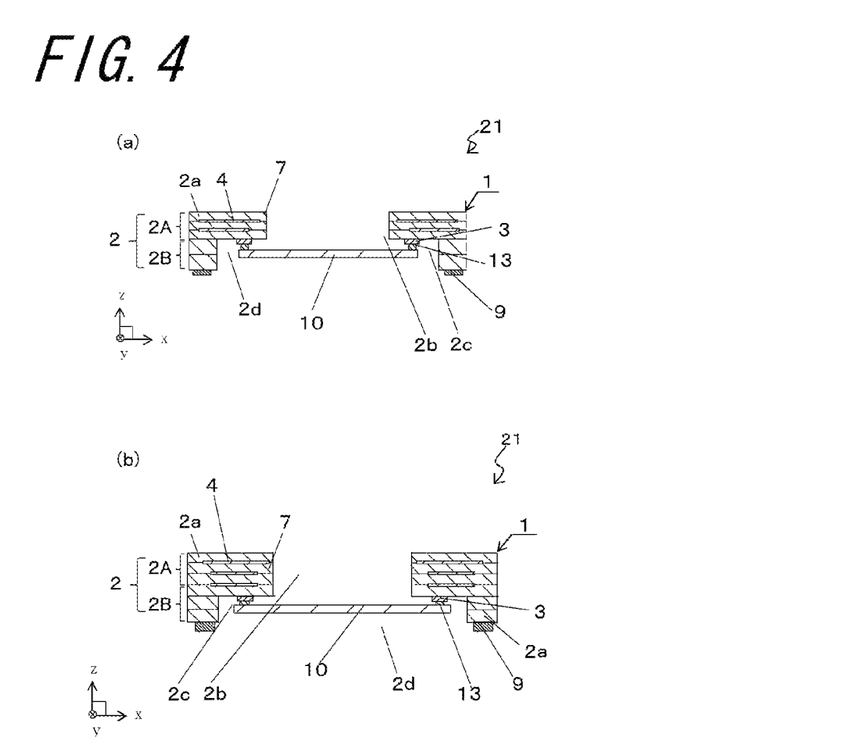
FIG. 4(a) and FIG. 4(b) are cross-sectional views illustrating another example of the electronic element mounting board and the electronic device illustrated in FIG. 3.

In addition, as in examples illustrated in FIG. 4, the auxiliary layers 4 are respectively provided between the plurality of insulating layers 2a, and a distance from the opening 2b of the auxiliary layer 4 located on the uppermost side is preferably shorter than those of the other auxiliary layers 4. Consequently, the auxiliary layers 4 can block light from being transmitted through the circumferential edge part 7 over a wider range.

In the example illustrated in FIG. 4(a), the auxiliary layers 4 are respectively provided in two interlayers between the insulating layers 2a of the insulating substrate 2. In the example illustrated in FIG. 4(b), the auxiliary layers 4 are respectively provided in three interlayers between the insulating layers 2a of the insulating substrate 2. As in the examples illustrated in FIG. 4, in a case where the auxiliary layers 4 are provided between the plurality of all insulating layers of the first frame 2A, this is preferable since an effect of preventing transmission of light is improved.

Figure 5:
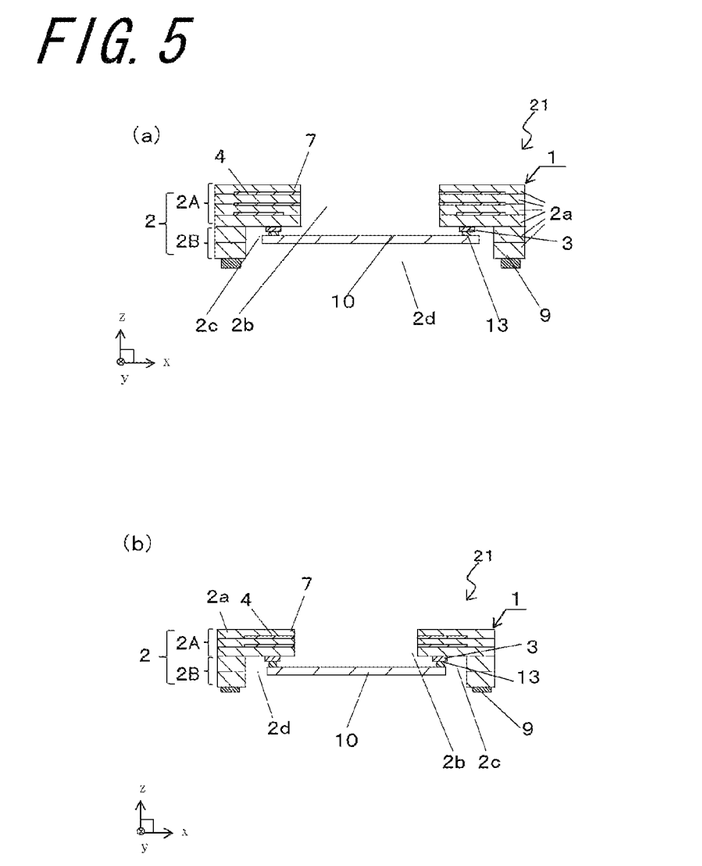
FIG. 5(a) and FIG. 5(b) are cross-sectional views illustrating still another example of the electronic element mounting board and the electronic device illustrated in FIG. 3.

In addition, as in examples illustrated in FIG. 5, a part of at least one of the auxiliary layers 4 is preferably exposed to the opening 2b. With this configuration, a portion close to the light receiving surface of the electronic element 10 in the circumferential edge part 7 can be covered by the auxiliary layer 4. Therefore, it is possible to further reduce the occurrence of noise caused by transmission of light. Further, as in the examples illustrated in FIG. 5, a part of the auxiliary layer 4 located on the uppermost side is exposed, and thus the auxiliary layers 4 can block light from being transmitted through the circumferential edge part 7 over a wider range.

In the example illustrated in FIG. 5(a), the auxiliary layers 4 are respectively provided in three interlayers between the insulating layers of the insulating substrate 2. In this example, among the three auxiliary layers 4, inner edges of the auxiliary layers 4 of the first and second layers from the top are exposed to the opening 2b.

In the example illustrated in FIG. 5(b), the auxiliary layers 4 are respectively provided in two interlayers between the insulating layers of the insulating substrate 2. In this example, inner edges of the two auxiliary layers 4 are all exposed to the opening 2b.

Third Embodiment

Next, with reference to FIG. 6 to FIG. 8, a description will be made of an electronic element mounting board 1 and an electronic device 21 according to a third embodiment of the invention. In addition, the lid body 12 is omitted in the electronic device 21 illustrated in FIG. 6 and FIG. 7. The electronic device 21 of the present embodiment is different from the electronic device 21 of the first embodiment in terms of a shape of the circumferential edge part 7. Further, also in the present embodiment, in the same manner as in the first embodiment, at least a part of the circumferential edge part 7 of the opening 2b of the insulating substrate 2 has the porosity lower than that of the portion outside the circumferential edge part 7.

Figure 6:
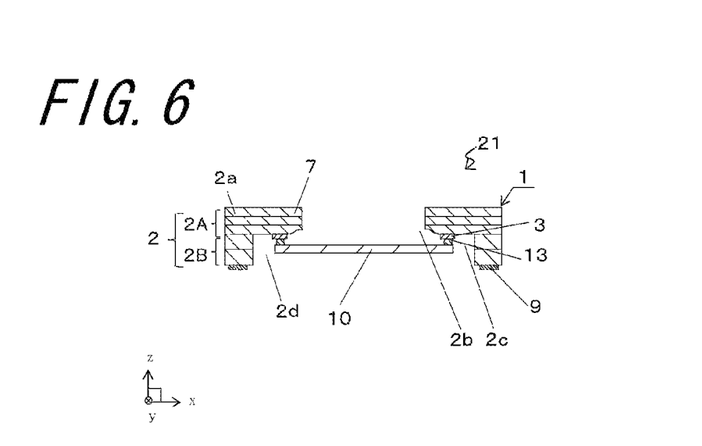
FIG. 6 is a cross-sectional view illustrating a cross-section of an electronic element mounting board and an electronic device according to a third embodiment of the invention.

In an example illustrated in FIG. 6, at least a part of the lower surface which part is located at the circumferential edge part 7 of the insulating substrate 2 is located further upward than the lower surface of the portion outside the circumferential edge part 7. In recent years, generally, there has been a demand for thinning of the electronic element mounting board 1. If the insulating substrate 2 is thinned, there is no support directly under the circumferential edge part 7 of the opening 2b of the insulating substrate 2 during manufacturing, and thus there is a concern that the circumferential edge part 7 of the opening 2b of the insulating substrate 2 may be deformed so as to hang down. Due to the deformation, there is a concern that the circumferential edge part 7 of the opening 2b of the insulating substrate 2 may come into contact with the electronic element 10 mounted on the insulating substrate 2. In this case, if at least a part of the lower surface of the circumferential edge part 7 is located further upward than the lower surface of the portion outside the circumferential edge part 7, the electronic element 10 can be made not to come into contact with the electronic element 10 even when the circumferential edge part 7 of the opening 2b of the insulating substrate 2 is deformed so as to hang down.

In addition, as in examples illustrated in FIG. 6, the circumferential edge part 7 of the opening 2b of the insulating substrate 2 may be thinner than the portion outside the circumferential edge part 7. In this case, if a thickness of the circumferential edge part 7 is set to approximately 60% to 90% of a thickness of the portion outside the circumferential edge part 7, this is preferable since contact between the electronic element 10 and the insulating substrate 2 can be reliably reduced.

In addition, in a case where the electronic element 10 is adhered to the insulating substrate 2 via an underfill, since the underfill is collected on the lower surface of the circumferential edge part 7, leakage of the underfill to a light receiving part of an imaging element can be suppressed, and favorable imaging can be performed.

In addition, since at least a part of the lower surface of the circumferential edge part is located further upward than the portion outside the circumferential edge part 7, a greater pressing force may be applied to the circumferential edge part 7 in the above-described step (4). Consequently, the porosity of the circumferential edge part 7 is reduced, and at least a part of the lower surface of the circumferential edge part 7 is located further upward than a part of the lower surface of the portion outside the circumferential edge part 7.

In addition, in the example illustrated in FIG. 6, the auxiliary layers 4 are not illustrated, and the auxiliary layers 4 may or may not be provided.

Figure 7:
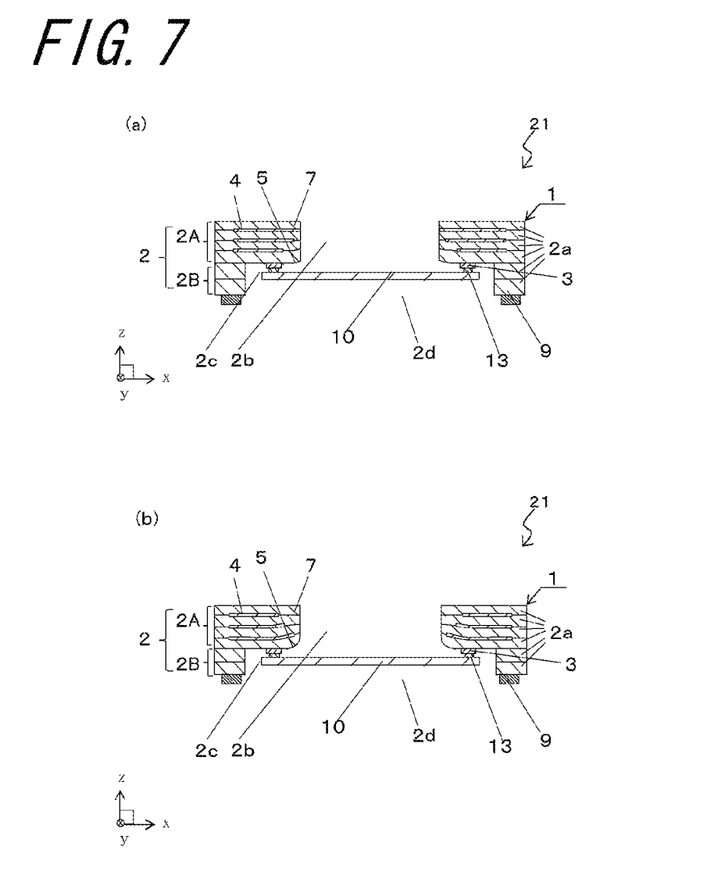
FIG. 7(a) and FIG. 7(b) are cross-sectional views illustrating another example of the electronic element mounting board and the electronic device illustrated in FIG. 6.
Figure 8:
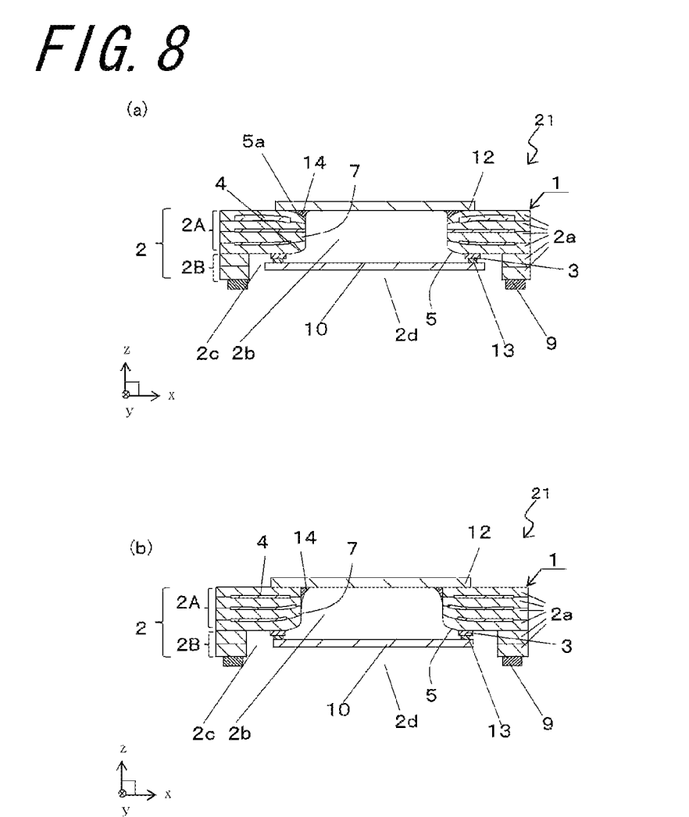
FIG. 8(a) and FIG. 8(b) are cross-sectional views illustrating still another example of the electronic element mounting board and the electronic device illustrated in FIG. 6.

In examples illustrated in FIG. 7, a tilt portion 5 which is tilted upwardly is provided on at least a part of the lower surface of the insulating substrate 2 which part is located at the circumferential edge part 7. This configuration is preferable since contact between the circumferential edge part 7 of the opening 2b of the insulating substrate 2 and the electronic element 10 mounted on the insulating substrate 2 can be reliably prevented.

In addition, if the tilt portion 5 is provided on at least a part of the lower surface which part is located at the circumferential edge part 7, this is preferable since contact between the circumferential edge part 7 and the electronic element mounted on the insulating substrate 2 can be more reliably prevented. Further, since the tilt portion 5 is provided, a starting point of stress concentration can be removed unlike in the example illustrated in FIG. 1 even if the stress is applied from outside, and thus it is possible to reduce chipping or cracking of the electronic element mounting board 1. Still further, since an edge of the circumferential edge part 5 has not an acute angle but an obtuse angle in a cross-sectional view, it is possible to reduce chipping in an edge of the opening in a manufacturing step or a mounting step, and thus such a configuration is preferable.

As in examples illustrated in FIG. 7, the electrode pad 3 is provided further outward than the tilt portion 5. If the electrode pad 3 is provided further outward than the tilt portion 5 in the above-described manner, flatness of the electrode pad 3 can be assured, and thus the electronic element 10 and the electrode pads 3 can be reliably electrically connected to each other.

Hereinafter, a description will be made of a method of forming the tilt portion 5. For example, a jig is prepared which has a surface tilted toward the center of an opening in the same shape as the shape of the electronic element mounting board 1 in a plan view and is provided with a plurality of holes through which a gas such as air can pass. The opening 2b of the ceramic green sheet laminate 22 before being fired which will become the electronic element mounting board 1 is in contact with the tilted surface of the jig, the upper surface of the electronic element mounting board 1 is provided facing downward so as to be in contact with a horizontal device. Then, a pressure is applied from the upper surface side of the electronic element mounting board 1, and a lower side of the jig is depressurized and suctioned up by using a vacuum pump or the like, so that the tilt portion is formed.

In addition, in the example illustrated in FIG. 7(a), the auxiliary layers 4 are respectively provided between a plurality of insulating layers, a distance from the opening 2b of the auxiliary layer 4 located on the uppermost side is shorter than that of the other auxiliary layers 4, the other auxiliary layers 4 include two or more auxiliary layers 4, and the other auxiliary layers 4 are gradually separated from the opening 2b when becoming closer to the lower surface.

Further, in the example illustrated in FIG. 7(b), a distance from the opening 2b of the auxiliary layer 4 located on the lowermost side is shorter than that of the other auxiliary layers 4, the other auxiliary layers 4 include two or more auxiliary layers 4, and the other auxiliary layers 4 are gradually separated from the opening 2b when becoming closer to the upper surface.

As mentioned above, according to the configurations illustrated in FIG. 7(a) and FIG. 7(b), in a case where a green sheet laminate which will become the first frame 2A of the insulating substrate 2 is manufactured, a thickness of the laminate becomes gradually thinner, and thus if the laminate is pressed in the method as illustrated in FIG. 9, the circumferential edge part 7 is easily tilted. Therefore, the above-described tilt portion 5 is easily formed.

In addition, as in the example illustrated in FIG. 8(a), a tilt portion 5a which is tilted downwardly may be provided at the circumferential edge part of the opening 2b on the upper surface of the insulating substrate 2. In this configuration, as in the example illustrated in FIG. 8(a), a joining member 14 may be provided in a gap formed between the tilt portion 5a and a lower surface of the lid body 12. The joining member 14 fills the gap, and thus a joining strength between the lid body 12 and the insulating substrate 2 can be increased.

Further, as in the example illustrated in FIG. 8(a), since the joining member 14 is provided in the gap, the joining member 14 can block light from being incident to the circumferential edge part 7. Still further, the joining member 14 is preferably black since light can be absorbed in that case.

In addition, in a case where the tilt portion 5a is provided on the upper surface of the insulating substrate 2, a convex part may also be provided on the pressing member on the upper surface side when the green sheet laminate which will become the first frame 2A is pressed.

In addition, as in the example illustrated in FIG. 8(a), inner edges of the auxiliary layers 4 located in the middle are located further toward the opening 2b side than those of the auxiliary layers 4 on the upper surface side and the lower surface side of the insulating substrate 2, and thus tilt portions are easily provided on both of the upper surface side and the lower surface side of the insulating substrate 2.

Further, as in the example illustrated in FIG. 8(b), even in a case where the tilt portion 5a is not provided on the upper surface of the insulating substrate 2, the joining member 14 is provided from the inner surface of the insulating substrate 2 to the lower surface of the lid body 12, and thus the joining member 14 can realize a light blocking function and a light absorbing function in the same manner as in the case of FIG. 8(a).

In addition, the invention is not limited to the above-described embodiments and various modifications are possible.

For example, a shape of the opening 2b of the insulating substrate 2 may be a circular shape, or other polygonal shapes instead of a rectangular shape.

Further, arrangements, the number, shapes, and the like of the electrode pads 3 and the external terminals 9 in the present embodiment are not designated.

Figure 10:
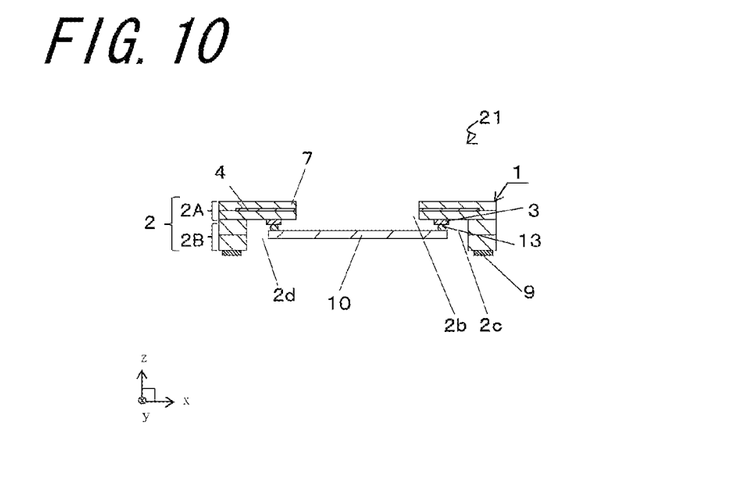
FIG. 10 is a cross-sectional view illustrating a cross-section of an electronic element mounting board and an electronic device in another embodiment of the invention.

Still further, in the above-described embodiments, the auxiliary layers 4 have been described as two layers or three layers as an example, but the auxiliary layer 4 may be composed of a single layer as in an example illustrated in FIG. 10. Furthermore, the auxiliary layers 4 may be composed of four or more layers. Moreover, naturally, the auxiliary layers 4 may not be provided.

In addition, in the above-described embodiments, a description has been made of an example in which an imaging element is used as the electronic element 10, but a light emitting element such as an LED may be used as the electronic element 10. In this case, it is possible to suppress emission of excess light which has been transmitted through the circumferential edge part 7 to the outside of the device from the electronic element 10. Therefore, it is possible to provide a highly accurate light emitting device.

Further, in the above-described embodiments, a description has been made of an example in which an electrically insulating ceramics is employed in the insulating substrate 2, but a resin material may be employed in the insulating substrate 2.

Furthermore, the electronic element mounting board 1 may have a plate shape without being provided with a portion corresponding to the through hole 2c, and without being provided with the recess 2d.

REFERENCE SIGNS LIST

1: Electronic element mounting board
2: Insulating substrate
2a: Insulating layer
2b: Opening
2c: Through hole of second frame 2B
2d: Recess
2A: First frame
2B: Second frame
3: Electrode pad
4: Auxiliary layer
5: (Lower surface side) Tilt portion
5a: (Upper surface side) Tilt portion
7: Circumferential edge part 9: External terminal
10: Electronic element
12: Lid body
13: Connection conductor
14: Joining member
21: Electronic device
22: Green sheet laminate

The invention claimed is:

1. An electronic element mounting board, comprising:
an insulating substrate which is made of electrically insulating ceramics, having a lower surface and provided with an opening which opens on the lower surface, the insulating substrate comprising a circumferential edge part defining the opening, and a portion outside the circumferential edge part; and
an electrode pad disposed on the lower surface around the opening,
at least a part of the circumferential edge part having a porosity lower than a porosity of the portion outside the circumferential edge part,
wherein a tilt portion, which is tilted upwardly, is provided on at least a part of the lower surface of the insulating substrate located at the circumferential edge part.

2. The electronic element mounting board according to claim 1,
wherein the insulating substrate is composed of a plurality of insulating layers,
wherein auxiliary layers are provided between the insulating layers of the insulating substrate, and
wherein a part of at least one of the auxiliary layers is located at the circumferential edge part.

3. The electronic element mounting board according to claim 2,
wherein the part of at least one of the auxiliary layers is exposed to the opening.

4. The electronic element mounting board according to claim 1,
wherein at least the part of the lower surface of the insulating substrate located at the circumferential edge part is located further upward than a part of the lower surface of the portion outside the circumferential edge part.

5. The electronic element mounting board according to claim 2,
wherein the auxiliary layers are respectively provided between the plurality of insulating layers, and
wherein an auxiliary layer located on an uppermost side has a shorter distance from the opening than the other auxiliary layers.

6. The electronic element mounting board according to claim 5,
wherein the other auxiliary layers include two or more auxiliary layers, and the other auxiliary layers are gradually separated from the opening when becoming closer to the lower surface.

7. The electronic element mounting board according to claim 1,
wherein the insulating substrate is black.

8. The electronic element mounting board according to claim 1,
wherein the part of the circumferential edge part, having the porosity lower than the porosity of the portion outside the circumferential edge part, is located so as to surround the opening.

9. An electronic device, comprising:
the electronic element mounting board according to claim 1; and
an electronic element which is disposed on a lower surface side so as to overlap the opening in a plan view and is electrically connected to the electrode pad.

* * * * *